US012738327B2

(12) United States Patent
Chen et al.

(10) Patent No.: US 12,738,327 B2
(45) Date of Patent: Sep. 15, 2026

(54) OPERATIONS ON PARTIALLY PROGRAMMED ERASE BLOCKS

(71) Applicant: Micron Technology, Inc., Boise, ID (US)

(72) Inventors: Hanping Chen, San Jose, CA (US); Zhongguang Xu, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 18/784,434

(22) Filed: Jul. 25, 2024

(65) Prior Publication Data

US 2025/0140320 A1 May 1, 2025

Related U.S. Application Data

(60) Provisional application No. 63/594,205, filed on Oct. 30, 2023, provisional application No. 63/546,019, filed on Oct. 27, 2023.

(51) Int. Cl.

| | |
|---|---|
| ***G11C 16/04*** | (2006.01) |
| ***G11C 16/08*** | (2006.01) |
| ***G11C 16/14*** | (2006.01) |
| ***G11C 16/26*** | (2006.01) |
| ***G11C 16/34*** | (2006.01) |

(52) U.S. Cl.

CPC .......... *G11C 16/26* (2013.01); *G11C 16/0483* (2013.01); *G11C 16/08* (2013.01); *G11C 16/14* (2013.01); *G11C 16/3418* (2013.01); *G11C 16/3459* (2013.01); *G11C 16/3445* (2013.01)

(58) Field of Classification Search

CPC ..... G11C 16/26; G11C 16/0483; G11C 16/08; G11C 16/14; G11C 16/3418; G11C 16/3459

USPC .................................................... 365/185.29

See application file for complete search history.

(56) References Cited

U.S. PATENT DOCUMENTS

| | | | | |
|---|---|---|---|---|
| 2013/0272067 | A1 | 10/2013 | Lee et al. | |
| 2017/0169890 | A1 | 6/2017 | Griffin et al. | |
| 2018/0374551 | A1 | 12/2018 | Hu | |
| 2020/0005878 | A1* | 1/2020 | Lu | G11C 11/5642 |
| 2020/0310643 | A1 | 10/2020 | Li et al. | |
| 2024/0303187 | A1* | 9/2024 | Shukla | G11C 11/5642 |

(Continued)

*Primary Examiner* — Ly D Pham

(74) *Attorney, Agent, or Firm* — Brooks, Cameron & Huebsch, PLLC

(57) ABSTRACT

Apparatuses and methods for performing sensing operations on partially programmed erase blocks are provided. One example apparatus can include a memory array comprising a plurality of erase blocks and a controller coupled to the memory array. The controller can be configured to apply a first sensing voltage to a first access line of a first group of access lines corresponding to the first erase block during a first sensing operation on the first erase block that is partially programmed, apply a first pass voltage to a number of programmed access lines of the first group of access lines corresponding to the first erase block during the first sensing operation, and apply a second pass voltage a number of unprogrammed access lines of the first group of access lines corresponding to the first erase block during the first sensing operation.

17 Claims, 9 Drawing Sheets

(56) References Cited

U.S. PATENT DOCUMENTS

2025/0029663 A1* 1/2025 Lien .................... G11C 11/5642
2025/0140325 A1* 5/2025 Chen ...................... G11C 16/14

* cited by examiner

646
PROGRAMMED
UNPROGRAMMED
Vpass 634
Vpass-low 640
BWL
622-P
648
Vpass-low 640
650
Vpass-low 640

646
Vpass 634
648
PROGRAMMED
UNPROGRAMMED
Vpass 634
Vpass-low 640
BWL
622-P
650
Vpass-low 640

646
Vpass 634
648
Vpass 634
650
PROGRAMMED
UNPROGRAMMED
Vpass 634
Vpass-low 640
BWL
622-P 746
748
750
PROGRAMMED
UNPROGRAMMED
Vpass 734
Vpass-low 740
BWL
722-P

OPERATIONS ON PARTIALLY PROGRAMMED ERASE BLOCKS

CROSS-REFERENCE TO RELATED APPLICATION

This Application claims the benefit of U.S. Provisional Application No. 63/546,019, filed on Oct. 27, 2023, and claims the benefit of U.S. Provisional Application No. 63/594,205, filed on Oct. 30, 2023, the contents of which are incorporated herein by reference.

TECHNICAL FIELD

The present disclosure relates generally to sensing operations, and more particularly, to apparatuses and methods for read and/or program verify operations on partially programmed erase blocks.

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

DETAILED DESCRIPTION

Figure 1:
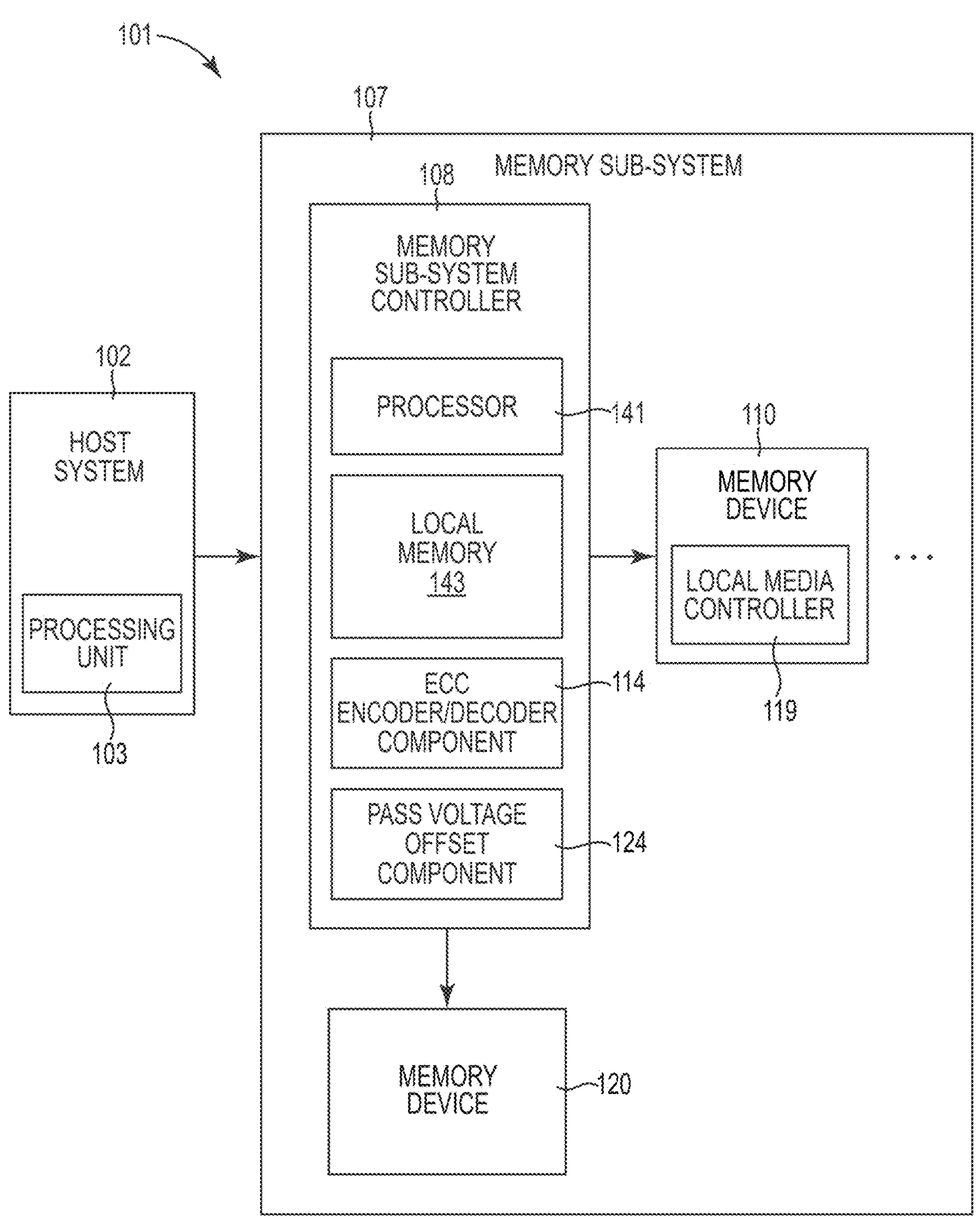
FIG. 1 illustrates an example computing system that includes a memory sub-system in accordance with embodiments of the present disclosure.

The present disclosure provides apparatuses and methods for performing sensing operations on partially programmed erase blocks. One example apparatus can include a memory array comprising a plurality of erase blocks and a controller coupled to the memory array. The plurality of erase blocks comprise a first group of memory cells coupled to a first group of access lines and corresponding to a first erase block; and a second group of memory cells coupled to a second group of access lines and corresponding to a second erase block. The controller can be configured to determine that a sensing operation request is for data stored in the first group of memory cells on a first access line of the first group of access lines corresponding to the first erase block, wherein the first erase block is a partially programmed; and apply a first sensing voltage to the first access line during a first sensing operation on the first access line, apply a first pass voltage to a number of programmed access lines of the first group of access lines corresponding to the first erase block during the first sensing operation, and apply a second pass voltage a number of unprogrammed access lines of the first group of access lines corresponding to the first erase block during the first sensing operation.

Aspects of the present disclosure are directed to apparatuses and methods for performing sensing operations on partially programmed erase blocks. Various types of memory, such as NAND flash memory, include a memory array of many memory cells that can be arranged in row and column fashion and grouped in physical blocks. The cells can include a charge storage node such as a floating gate or charge-trap layer which allows the cells to be programmed to store one more bits by adjusting the charge stored on the storage node. Generally, an erase operation (e.g., a “block erase”) is performed to erase all of the cells of a physical block together as a group.

Three-dimensional (3D) flash memory (e.g., a 3D NAND memory array) can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as word lines (WLs). Each access line can be coupled to respective memory cells of each string in the group of strings (e.g., the memory cells of a particular tier of the memory array). Groups of strings are coupled to respective sense lines (which may be referred to as data lines or bit lines (BLs)) of a group of sense lines. The cells of the strings can be positioned between a drain-side select gate (referred to as a select gate drain (SGD)) and a source-side select gate (referred to as select gate source (SGS)) used to control access to the strings. A 3D NAND array can be a replacement gate (RG) NAND array or a floating gate NAND array, for example.

A 3D memory array can comprise multiple physical blocks each comprising a plurality of memory pages (e.g., physical pages of cells than can store one or more logical pages of data). In various previous approaches, a block of memory cells corresponds to a smallest group of memory cells that can be erased. For example, in prior approaches it is not possible to erase some of the memory cells (e.g., a first sub-block) of a physical block while maintaining data in other memory cells (e.g., a second sub-block) of the physical block.

As used herein, an "erase block" refers to a group of cells that are configured to be erased together as a group and that share a same string as one or more additional groups of cells (e.g., one or more additional erase blocks). An erase block may also be referred to as a "deck." As such, a physical block of cells can include multiple decks each capable of undergoing program/erase (P/E) cycling irrespective of the other decks. Decks experiencing disturb due to operations (e.g., read operations, program verify operations) performed on one or more other decks sharing a string are referred to as "victim" decks, with the one or more other decks being referred to as "aggressor" decks.

When a memory device is being programmed, a command (e.g. a read command and/or a write command) may be received for data that is located in a partially programmed erase block (e.g., an erase block where a portion of the word lines are programmed and a portion of the word lines are unprogrammed in an erased state), which results in a sensing operation (e.g., read operation and/or program verify operation) being performed on the partially programmed erase block. During a sensing operation, the threshold voltage for memory cells in a partially programmed erase block can be different than the threshold voltage of memory cells in a fully programmed erase block due to the back pattern effect. When the same pass voltage is applied to the word lines that are not being sensed in a partially programmed erase block and in a fully programmed erase block, the word lines being sensed in a partially programmed erase block can have a lower threshold voltage than word lines being sensed in a fully programmed erase block due to a partially programmed block experiencing a different string current than a fully programmed erase block.

When sensing memory cells, errors can occur that are caused by memory cells in a partially programmed erase block having lower threshold voltages when using sensing signals (e.g., sensing voltages and/or pass voltages) that are also used for fully programmed erase blocks. Embodiments of the present disclosure can reduce these errors by reducing the pass voltage on unprogrammed word lines with a pass voltage offset during sensing operations. The pass voltage offsets can reduce the pass voltages for unprogrammed word lines of a partially programmed erase block to reduce and/or eliminate the downward shift in threshold voltages when sensing memory cells in a partially programmed erase block.

In a number of embodiments, when performing a sensing operation on a partially programmed erase block, a pass voltage offset can be applied to lower the pass voltages on unprogrammed word lines when sensing the memory cells coupled to a word line being sensed. Lowering the pass voltages on unprogrammed word lines during a sensing operation can reduce the drop in threshold voltage when sensing the memory cells in a partially programmed erase block while using sensing voltages and/or pass voltages on programmed word lines that are also used when reading memory cells in a fully programmed erase block, such that the threshold voltage distributions for word lines in partially programmed erase blocks read using the lowered pass voltages on unprogrammed word lines of the present disclosure are similar to the threshold voltage distributions for word lines in fully programmed erase blocks read where the same sensing voltages can be used to sense word lines in both partially programmed erase blocks and fully programmed erase blocks. Also, lowering the pass voltages on unprogrammed word lines can reduce the supply current used during sensing operations on partially programmed erase blocks.

In a number of embodiments, pass voltage offsets can be calculated for each erase block based on a quantity or relative quantity, such as percentage, of unprogrammed word lines in the partially programmed word lines and/or the read level of the read operation.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M", "N", and "P" as used herein, particularly with respect to reference numerals in the drawings, indicates that a number of the particular feature so designated can be included with a number of embodiments of the present disclosure.

The figures herein follow a numbering convention in which the first bit or bits correspond to the drawing figure number and the remaining bits identify an element or component in the drawing. Similar elements or components between different figures may be identified by the use of similar bits. For example, 100 may reference element "00" in FIG. 1, and a similar element may be referenced as 600 in FIG. 6. Elements shown in the various embodiments herein can be added, exchanged, and/or eliminated so as to provide a number of additional embodiments of the present disclosure. In addition, the proportion and the relative scale of the elements provided in the figures are intended to illustrate the embodiments of the present disclosure, and should not be taken in a limiting sense.

FIG. 1 illustrates an example computing system 100 that includes a memory sub-system 107 in accordance with embodiments of the present disclosure. The memory sub-system 107 can include media, such as one or more volatile memory devices (e.g., memory device 120), one or more non-volatile memory devices (e.g., memory device 110), or a combination of such.

A memory sub-system 107 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, data server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device The computing system 100 can include a host system 102 that is coupled to one or more memory sub-systems 107. In some embodiments, the host system 102 is coupled to different types of memory sub-system 107. FIG. 1 illustrates one example of a host system 102 coupled to one memory sub-system 107. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 102 can include a processor chipset and a software stack executed by the processor chipset. The processor chipset can include one or more cores, one or more caches, a memory controller (e.g., an SSD controller), and a storage protocol controller (e.g., PCIe controller, SATA controller, CXL controller). The host system 102 uses the memory sub-system 107, for example, to write data to the memory sub-system 107 and read data from the memory sub-system 107.

The host system 102 includes a processing unit 103. The processing unit 103 can be a central processing unit (CPU) that is configured to execute an operating system. In some embodiments, processing unit 103 comprises a complex instruction set computer architecture, such an x86 or other architecture suitable for use as a CPU for a host system 102.

The host system 102 can be coupled to the memory sub-system 107 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 107. The host system 102 can further utilize an NVM Express (NVMe) interface to access components (e.g., memory devices 110) when the memory sub-system 107 is coupled with the host system 102 by the PCIe interface. The physical host interface can provide an interface for passing control, address, data, and other signals between the memory sub-system 107 and the host system 102. FIG. 1 illustrates memory sub-system 107 as an example. In general, the host system 102 can access multiple memory sub-systems via a same communication connection, multiple separate communication connections, and/or a combination of communication connections.

The memory devices 110, 120 can include any combination of the different types of non-volatile memory devices and/or volatile memory devices. The volatile memory devices (e.g., memory device 120) can be, but are not limited to, random access memory (RAM), such as dynamic random-access memory (DRAM) and synchronous dynamic random access memory (SDRAM).

Some examples of non-volatile memory devices (e.g., memory device 110) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 110, 120 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, the memory device 110 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory device 110 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 110 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 108 (or controller 108 for simplicity) can communicate with the memory device 110 to perform operations such as reading data, writing data, or erasing data at the memory device 110 and other such operations. The memory sub-system controller 108 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 108 can be a microcontroller, special purpose logic circuitry (e.g., a field programmable gate array (FPGA), an application specific integrated circuit (ASIC), etc.), or other suitable processors.

The memory sub-system controller 108 can include a processor 141 (e.g., a processing device) configured to execute instructions stored in a local memory 143. In the illustrated example, the local memory 143 of the memory sub-system controller 108 includes an embedded memory configured to store instructions for performing various processes, operations, logic flows, and routines that control operation of the memory sub-system 107, including handling communications between the memory sub-system 107 and the host system 102. Local memory 143 can include DRAM and/or static random access memory (SRAM).

In some embodiments, the local memory 143 can include memory registers storing memory pointers, fetched data, etc. The local memory 143 can also include read-only memory (ROM) for storing micro-code. While the example memory sub-system 107 in FIG. 1 has been illustrated as including the memory sub-system controller 108, in another embodiment of the present disclosure, a memory sub-system 107 does not include a memory sub-system controller 108, and can instead rely upon external control (e.g., provided by an external host, or by a processor or controller separate from the memory sub-system).

In general, the memory sub-system controller 108 can receive commands or operations from the host system 102 and can convert the commands or operations into instructions or appropriate commands to achieve the desired access to the memory device 110 and/or the memory device 120. The memory sub-system controller 108 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory device 110. The memory sub-system controller 108 can further include host interface circuitry to communicate with the host system 102 via the physical host interface. The host interface circuitry can convert the commands received from the host system into command instructions to access the memory device 110 and/or the memory device 120 as well as convert responses associated with the memory device 110 and/or the memory device 120 into information for the host system 102.

The memory sub-system 107 can also include additional circuitry or components that are not illustrated. In some embodiments, the memory sub-system 107 can include a cache or buffer (e.g., DRAM) and address circuitry (e.g., a row decoder and a column decoder) that can receive an address from the memory sub-system controller 108 and decode the address to access the memory device 110 and/or the memory device 120.

In some embodiments, the memory device 110 includes local media controller 119 that operates in conjunction with memory sub-system controller 108 to execute operations on one or more memory cells of the memory devices 110. An external controller (e.g., memory sub-system controller 108) can externally manage the memory device 110 (e.g., perform media management operations on the memory device 110). In some embodiments, memory device 110 is a managed memory device, which is a raw memory device combined with a local controller (e.g., local controller 119) for media management within the same memory device package. An example of a managed memory device is a managed NAND (MNAND) device.

The memory sub-system 107 can include an error correcting code (ECC) encoder/decoder component 114. Although not shown in FIG. 1 so as to not obfuscate the drawings, the ECC encoder/decoder component 114 can be implemented as firmware and/or include various circuitry to monitor, analyze, store, and/or allow for ECC operations by the memory sub-system 107. The ECC encoder/decoder component 114 can be a low-density parity-check (LDPC) encoder/decoder, for instance, which can encode/decode user data transferred between host system 102 and the memory devices 110 and/or 120.

The memory sub-system 107 can include pass voltage offset component 124. Although not shown in FIG. 1 so as to not obfuscate the drawings, the pass voltage offset component 124 can be implemented as firmware and/or include various circuitry to monitor, analyze, store, and/or allow for pass voltage offsets to be used by the memory sub-system 107 when reading data from the memory devices 110 and/or 120. The pass voltage offset component 124 can be used to determine pass voltage offsets to apply to the word lines that are not being read when performing a sensing operation on a partially programmed erase block. Pass voltage off sets can be determined by the pass voltage offset component 124 based on word line groupings, such that each word line in the word line group can have the same pass voltage off sets applied when sensing memory cells coupled a word line in a partially programmed erase block. The word line groups can be based upon the location of the word lines within a memory array and/or a erase block in a memory array (e.g., whether the word line is a programmed or unprogrammed and/or adjacent to a word line that is being read) and/or common electrical and/or physical characteristics of the word lines in a word line group.

Figure 2:
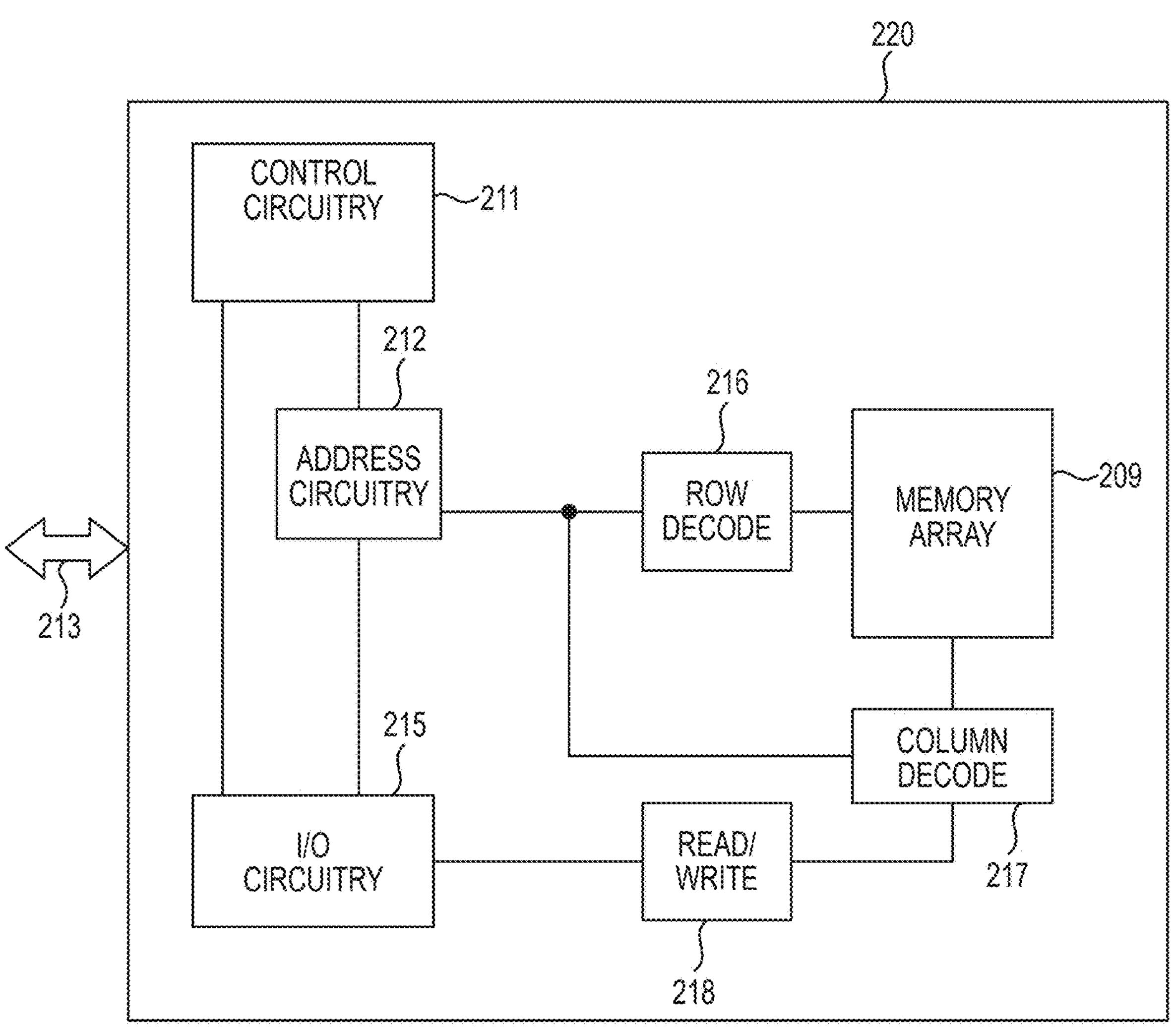
FIG. 2 illustrates an example portion of a memory system including a memory device having an array in accordance with various embodiments of the present disclosure.

FIG. 2 illustrates an example portion of a memory system including a memory device 220 having and array 209 in accordance with various embodiments of the present disclosure. The memory array 209 can be a 3D NAND array such as described further in association with FIG. 3, for example. The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell. The memory device 100 can be part of a memory system such as memory system 190 described in FIG. 1.

The memory device 220 includes control circuitry 211, address circuitry 212, and input/output (I/O) circuitry 215 used to communicate with an external device via an interface 213. The interface 213 can include, for example, a bus used to transmit data, address, and control signals, among other signals between the memory device 220 and an external host device, which can include a controller (e.g., system controller such as controller 191 shown in FIG. 1), host processor (e.g., host 192 shown in in FIG. 1), etc., that is capable of accessing the memory array 209. As an example, the memory device 220 can be within a system such as an SSD with the interface 213 coupling the memory device 220 to a system controller. The interface 213 can include a combined address, control, and data bus or separate busses depending on the particular physical interface and corresponding protocol. The interface 213 can be an Open NAND Flash Interface (ONFI) interface or a Non-Volatile Memory Express (NVMe) interface, a serial attached SCSI (SAS), a serial AT attachment (SATA) interface, a peripheral component interconnect express (PCIe) interface, a universal flash storage (UFS) interface, an I2C/13C interface, and/or other suitable interface (e.g., a parallel interface); however, embodiments are not limited to a particular type of interface or protocol.

The control circuitry 211 can decode signals (e.g., commands) received via interface 213 and executed to control operations performed on the memory array 209. The operations can include data programming operations, which may be referred to as write operations, data read operations, which may be referred to as sensing operations (and can include program verify operations), data erase operations, etc. The control circuitry 211 can cause various groups of memory cells (e.g., pages, blocks, erase blocks, etc.) to be selected or deselected in association with performing memory operations on the array 209. The control circuitry 211 can comprise a state machine, a sequencer, and/or some other type of control circuitry, which may be implemented in the form of hardware, firmware, or software, or any combination thereof.

The I/O circuitry 215 is used for bi-directional communication of data between the memory array 209 and the external device via interface 213. The address circuitry 212, which can include a register, can latch address signals received thereto, and the address signals can be decoded by a row decoder 216 and a column decoder 217 to access the memory array 209. The memory device 220 includes read/write circuitry 218 used to read data from and write data to the memory array 209. As an example, the read/write circuitry can include various latch circuitry, drivers, sense amplifiers, buffers, etc. Data can be read from the memory array 209 by sensing voltage and/or current changes on bit lines of the memory array 209.

A sensing operation, which can refer to a read operation and/or a program verify operation, can include sensing a voltage and/or current change of a bit line coupled to a selected cell in order to determine the state of the selected cell. The states of a particular fractional bit memory cell may not correspond directly to a data value of the particular memory cell, rather the states of a group of memory cells including the particular memory cell together map to a data value having an integer number of bits. The read operation can include pre-charging a bit line using a bit line bias and detecting the discharge when a selected cell begins to conduct.

Determining (e.g., detecting) the state of a selected cell can include providing a number of sensing signals (e.g., read voltages) to a selected word line while providing a number of voltages (e.g., read pass voltages) to the word lines coupled to the unselected cells of the string sufficient to place the unselected cells in a conducting state independent of the threshold voltage of the unselected cells. The bit line corresponding to the selected cell being read and/or verified can be detected to determine whether or not the selected cell conducts in response to the particular sensing signal applied to the selected word line. For example, the state of a selected cell can be determined by the word line voltage at which the bit line current reaches a particular reference current associated with a particular state.

The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell.

MLCs can be two-bit (e.g., four-state) memory cells, or can store more than two bits of data per memory cell, including fractional bits of data per memory cell. For example, a two-bit memory cell can be programmed to one of four states (e.g., P0, P1, P2, and P3), respectively. In operation, a number of memory cells, such as in a selected block, can be programmed such that they have a Vt level corresponding to either P0, P1, P2, or P3. As an example, state P0 can represent a stored data value such as binary "11". State P1 can represent a stored data value such as binary "10". State P2 can represent a stored data value such as binary "00". State P3 can represent a stored data value such as binary "01". However, embodiments are not limited to these data value correspondence.

TLCs can be three-bit (e.g., eight-state) memory cells, or can store more than three bits of data per memory cell, including fractional bits of data per memory cell. For example, a three-bit memory cell can be programmed to one of eight states (e.g., P0, P1, P2, P3, P4, P5, P6, or P7), respectively. In operation, a number of memory cells, such as in a selected block, can be programmed such that they have a Vt level corresponding to either P0, P1, P2, P3, P4, P5, P6, or P7. As an example, state P0 can represent a stored data value such as binary "111". State P1 can represent a stored data value such as binary "110". State P2 can represent a stored data value such as binary "101". State P3 can represent a stored data value such as binary "100". State P4 can represent a stored data value such as binary "011". State P5 can represent a stored data value such as binary "010". State P6 can represent a stored data value such as binary "001". State P7 can represent a stored data value such as binary "000". However, embodiments are not limited to these data value correspondence.

QLCs can be four-bit (e.g., sixteen-state) memory cells, or can store more than four bits of data per memory cell, including fractional bits of data per memory cell. For example, a four-bit memory cell can be programmed to one of sixteen states (e.g., P0, P1, P2, P3, P4, P5, P6, P7, P8, P9, P10, P11, P12, P13, P14, or P15), respectively. In operation, a number of memory cells, such as in a selected block, can be programmed such that they have a Vt level corresponding to either P0, P1, P2, P3, P4, P5, P6, or P7. As an example, P0 can represent a stored data value such as binary "1111". State P1 can represent a stored data value such as binary "1100". State P2 can represent a stored data value such as binary "1101". State P3 can represent a stored data value such as binary "1100". State P4 can represent a stored data value such as binary "1011". State P5 can represent a stored data value such as binary "1010". State P6 can represent a stored data value such as binary "1001". State P7 can represent a stored data value such as binary "1000". State P8 can represent a stored data value such as binary "0111". State P9 can represent a stored data value such as binary "0110". State P10 can represent a stored data value such as binary "0101". State P11 can represent a stored data value such as binary "0100". State P12 can represent a stored data value such as binary "0011". State P13 can represent a stored data value such as binary "0010". State P14 can represent a stored data value such as binary "0001". State P15 can represent a stored data value such as binary "0000". However, embodiments are not limited to these data value correspondence.

Figure 3:
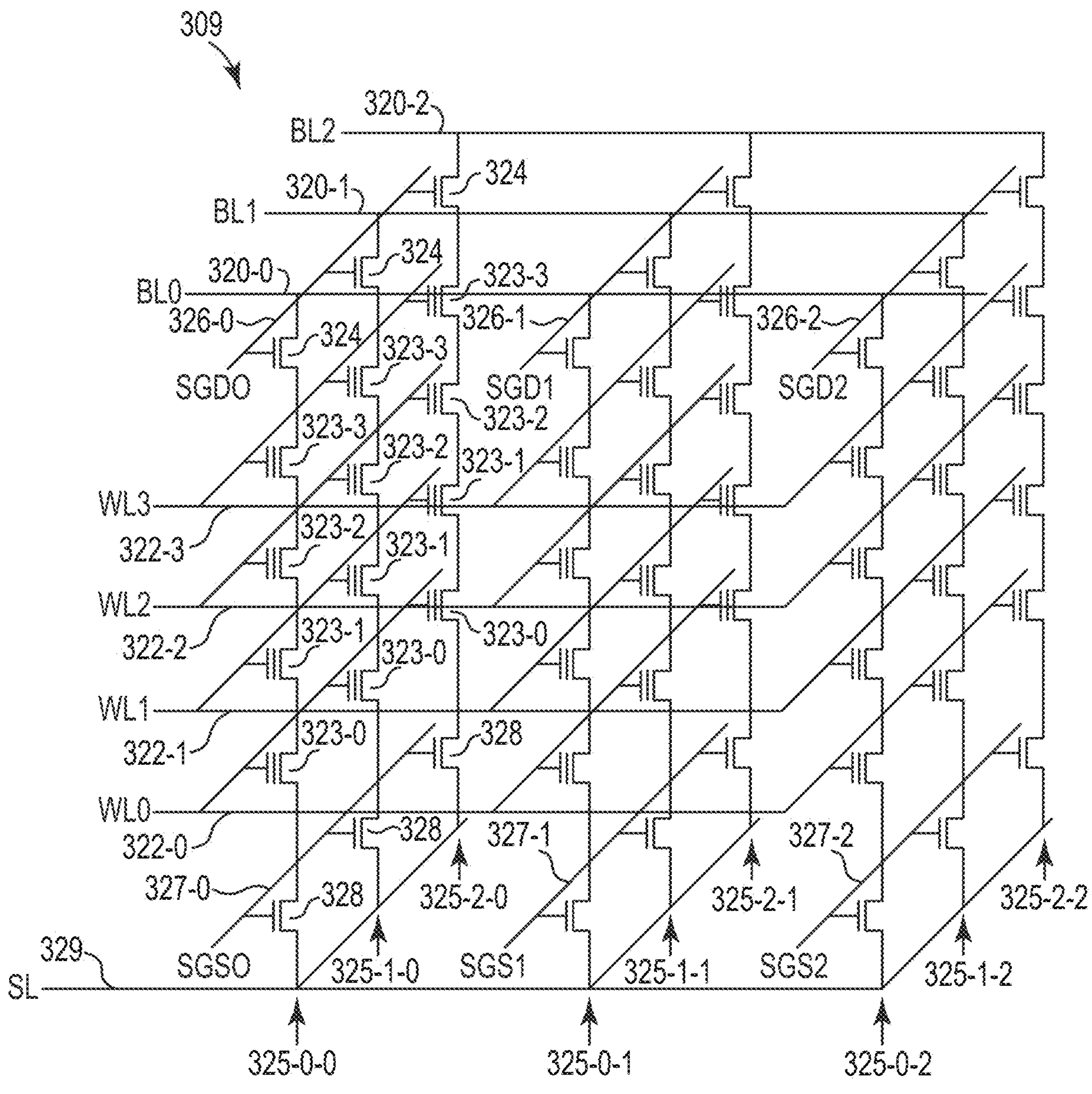
FIG. 3 is a schematic diagram illustrating an example memory array that can be operated in accordance with various embodiments of the present disclosure.

FIG. 3 is a schematic diagram illustrating an example memory array 309 in accordance with various embodiments of the present disclosure. The memory array 309 can be located in a memory device such as memory device 220 described in FIG. 2, for example. The memory array 309 is a 3D NAND array (e.g., RG NAND array or a floating gate NAND array).

The memory array 309 comprises a number of access lines (word lines) 322-0 (WL0), 322-1 (WL1), 322-2 (WL2), and 322-3 (WL3) and a number of sense lines (bit lines) 320-0 (BL0), 320-1 (BL1), and 320-2 (BL2) coupled to multiple strings 325-0-0, 325-0-1, 325-0-2, 325-1-0, 325-1-1, 325-1-2, 325-2-0, 325-2-1, and 325-2-2. The word lines, bit lines, and strings are collectively referred to as word lines 322, bit lines 320, and strings 325, respectively. Although four word lines 322, three bit lines 320, and nine strings 325 are shown, embodiments are not so limited.

Each of the strings 325 comprises a number of memory cells (referred to collectively as memory cells 323) located between a select transistor 324 and a select transistor 328. For example, as shown in FIG. 3, strings 325-0-0, 325-1-0, and 325-1-2 each respectively comprise memory cells 323-0, 323-2, 323-2, and 323-3 located between select transistors 324 and 328 (e.g., respective drain-side select gate (SGD) 324 and source-side select gate (SGS) 328). The memory cells 323 can be floating gate transistors or charge trap cells with the cells 323 of a given string 325 sharing a common channel region (e.g., pillar). As shown, the memory cells 323 of a given string are series-coupled source to drain between the SGD transistor 324 and the SGS.

The memory cells 323 of the strings 325 are stacked vertically such that they are located on distinct tiers/levels of the memory array 309. Each word line 322 can be commonly coupled to all the memory cells at a particular tier/level. For example, word line 322-0 can be coupled to (e.g., as the control gate) the nine memory cells 323-0 corresponding to the nine respective strings 325.

The select gate transistors 324 and 328 can be controlled (e.g., turned on/off) via the corresponding select gate signals SGD0, SGD1, SGD2, SGS0, SGS1, and SGS2 in order to couple the strings 325 to their respective bit lines 320 and a common source line (SL) 329 during memory operations (e.g., reads, writes, erases). As shown in FIG. 3, the select gate signals SGD0, SGD1, and SGD2 are provided (e.g., to the gates of transistors 324) via respective conductive lines 326-0, 326-1, and 326-3, and the select gate signals SGS0, SGS1, and SGS2 are provided (e.g., to the gates of transistors 328) via respective conductive lines 327-0, 327-1, and 327-2. Although the signals SGS0, SGS1, and SGS2 are shown on separate conductive lines 327, in some embodiments the conductive lines 327-0, 327-1, and 327-2 may be coupled via a common SGS line.

To perform memory operations on the array 309, particular voltages (e.g., bias voltages) can be applied to the word lines 322, bit lines 320, and source line 329. The particular voltages applied depends on the memory operation being performed, and different voltages may be applied to the word lines 322 during a particular memory operation in order to store data in a cell (or page of cells) or read data from a cell. For example, an erase operation to remove data from a selected group of memory cells (e.g., a selected erase block) can include applying a relatively high voltage (e.g., 20V) to the source line 329, the relatively high voltage (e.g., 20V) to unselected word lines (e.g., word lines coupled to cells of an erase block not being erased), and a relatively low voltage (e.g., 0V) to the selected word lines (e.g., the word lines coupled to the erase block being erased), which results in erasing of the cells of the selected erase block by removing charge from their charge storage nodes (e.g., charge-trap layers or floating gates) and thereby reducing their Vt levels to near 0V, for example. Additional example biasing schemes are described in more detail in association with FIG. 4.

Figure 4:
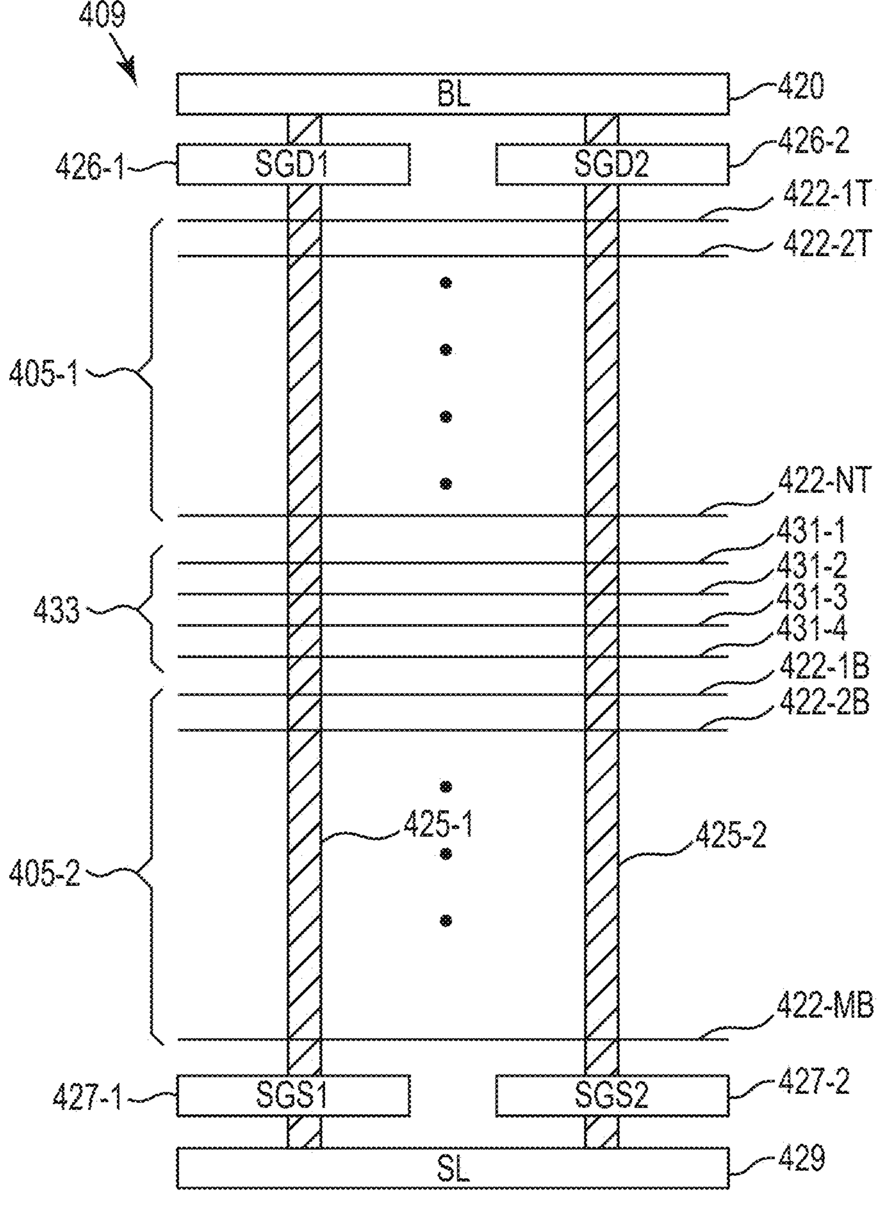
FIG. 4 schematically illustrates a portion of a memory array having multiple erase blocks per string and that can be operated in accordance with various embodiments of the present disclosure.

As described further in FIG. 4, the memory cells 323 of the array 309 can represent a physical block of memory cells that can comprise multiple (e.g., two or more) physical erase blocks. As an example, the word lines 322-0 and 322-1 can be coupled to cells of a first erase block, and the word lines 322-2 and 322-3 can be coupled to cells of a second/different erase block. Therefore, the cells 323-0 and 323-1 of the nine respective strings 325 (e.g., the cells of the first erase block) share respective common strings (e.g., common channel) with the cells 323-2 and 323-3 (e.g., the cells of the second erase block).

As further described herein, an array (e.g., 309) can comprise a number of word lines physically between (e.g., separating) the word lines (e.g., 322) corresponding to different erase blocks. The word lines separating word lines corresponding to different erase blocks can be referred to as "dummy" word lines and can be coupled to dummy memory cells (e.g., within the strings 325) that are not used to store data. The dummy word lines and/or dummy cells can facilitate the ability to perform erase operations separately on erase blocks that share a common string or strings. For example, one erase block within a physical block can be erased without erasing one or more other erase blocks within the physical block. The quantity of dummy word lines between erase blocks can vary, and various bias voltages can be applied to the dummy word lines during the various memory operations performed on the erase blocks.

In operation, erase blocks can be separately (e.g., individually) selected or deselected. For example, an erase operation can be performed on a selected first erase block corresponding to a group of strings while another erase block(s) corresponding to the same group of strings is deselected for the erase operation (e.g., such that is not erased).

FIG. 4 schematically illustrates a portion of a memory array 409 having multiple erase blocks per string that can be operated in accordance with various embodiments of the present disclosure. The example shown can be a portion of the array 309 described in FIG. 3. The array portion 409 can be a portion of a physical block of memory cells that includes multiple erase blocks (e.g., decks); although, embodiments of the present disclosure are not limited to arrays comprising multiple erase blocks per physical block.

In this example, the array 409 includes a plurality/group of word lines 422-1T, 422-2T, . . . , 422-NT corresponding to a first erase block 405-1 (e.g., a top deck) and a plurality/group of word lines 422-1B, 422-2B, . . . , 422-MB corresponding to a second erase block 405-2 (e.g., bottom deck). The designators "N" and "M" can represent various numbers (e.g., 3 or more) and "N" and "M" can be the same number. Accordingly, embodiments are not limited to a particular quantity of word lines 422 for the top deck 405-1 or bottom deck 405-2 (the designator "T" corresponding to "top" and the designator "B" corresponding to "bottom"). The array 409 also includes a number of dummy word lines 431-1, 431-2, 431-3, and 431-4, which can be collectively referred to as word lines 431. The dummy word lines 431 correspond to a separation region 433 between the top deck 405-1 and bottom deck 405-2. Although four word lines 431 are illustrated, embodiments can include more or fewer than four dummy word lines 431 separating erase blocks corresponding to same strings.

The array portion 409 illustrates two strings 425-1 and 425-2 for ease of illustration; however, embodiments can include many more strings 425. Memory cells are located at the intersections of the word lines 422/431 and strings 425, with the memory cells of a particular string 425 sharing a common channel region (e.g., pillar) as described in FIG. 3. The dummy word lines 431 can be coupled to dummy memory cells (e.g., cells that are not addressable to store user data).

As illustrated in FIG. 4, a first end of the strings 425-1 and 425-2 can be coupled to a common source line 429 via respective select gate source lines 427-1 (SGS1) and 427-2 (SGS2). The second/opposite end of the strings 425-1 and 425-2 can be coupled to a bit line 420 via respective select gate drain lines 426-1 (SGD1) and 426-2 (SGD2). As such, the strings 425 (e.g., the cells thereof) can be individually accessed using the bit line 420 and select gates to which the lines 426-1 and 426-2 are coupled. Although only a single bit line 420 is shown, embodiments can include multiple bit lines such as shown in FIG. 2, for example.

As noted herein, in various embodiments, the top deck 405-1 and the bottom deck 405-2 can be read, programmed, and/or erased via separate operations even though the cells of the decks 405-1/405-2 share the same strings 425-1/425-2. For example, each one of the decks 405-1 and 405-2 can be individually programmed and/or erased without programming or erasing the other of the decks 405-1 and 405-2.

Figure 5:
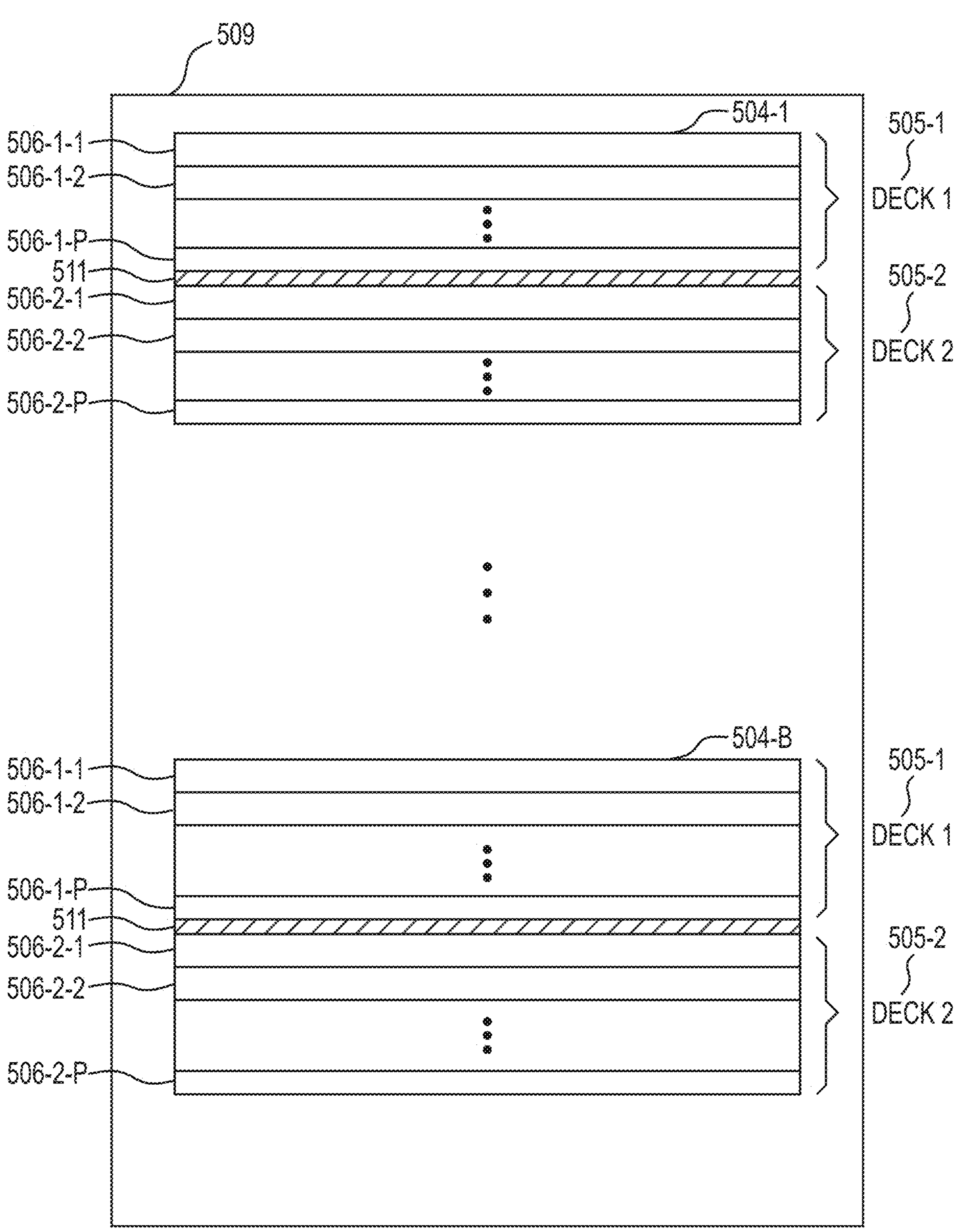
FIG. 5 illustrates a portion of a memory array having multiple erase blocks per string in accordance with various embodiments of the present disclosure.

FIG. 5 illustrates a portion of a memory array 509 having multiple erase blocks per string in accordance with various embodiments of the present disclosure. The memory array 509 includes multiple physical blocks 504-1, . . . , 504-B and can be operated in accordance with one or more embodiments of the present disclosure. The indicator "B" is used to indicate that the array 509 can include a number of physical blocks 504. As an example, the number of physical blocks in array 509 can be 128 blocks, 512 blocks, or 1,024 blocks, but embodiments are not limited to a particular multiple of 128 or to any particular number of physical blocks in an array 509. The memory array 509 can be, for example, a NAND flash memory array (e.g., a 3D NAND flash array such as array 209, 309, 409, and/or 509).

Each of the physical blocks 504-1, . . . , 504-B includes a first erase block 505-1 (DECK_1) and a second erase block 505-2 (DECK_2) separated by a region 511, which can correspond to a region of dummy word lines such as word lines 431 shown in FIG. 4. As described above, the decks 505-1 and 505-2 are commonly coupled to the strings of the blocks 504-1, . . . , 504-B with the decks 505-1 and 505-2 being separately erasable via a block erase operation (e.g., deck 505-1 can be erased without erasing deck 505-2 and vice versa). Although the physical blocks 504 are shown as including two decks, embodiments are not so limited. For example, the physical blocks 504 can include more than two decks and in some embodiments different physical blocks 504 can include different quantities of decks.

Each deck 505-1 and 505-2 can comprise a number of physical pages, which can correspond to a "row" of the array corresponding to a particular word line. As shown, deck 505-1 comprises pages 506-1-1, 506-1-2, . . . , 506-1-P, and deck 505-2 comprises pages 506-2-1, 506-2-2, . . . , 506-2-P. The designator "P" is used to indicate that the decks 505-1 and 505-2 can comprise a plurality of pages/rows. Each physical page (collectively referred to as pages 506) can store multiple logical pages of data. A page can refer to a unit of programming and/or reading (e.g., a group of cells that are programmed and/or read together as a functional group).

Figures 6A, 6B, 6C:
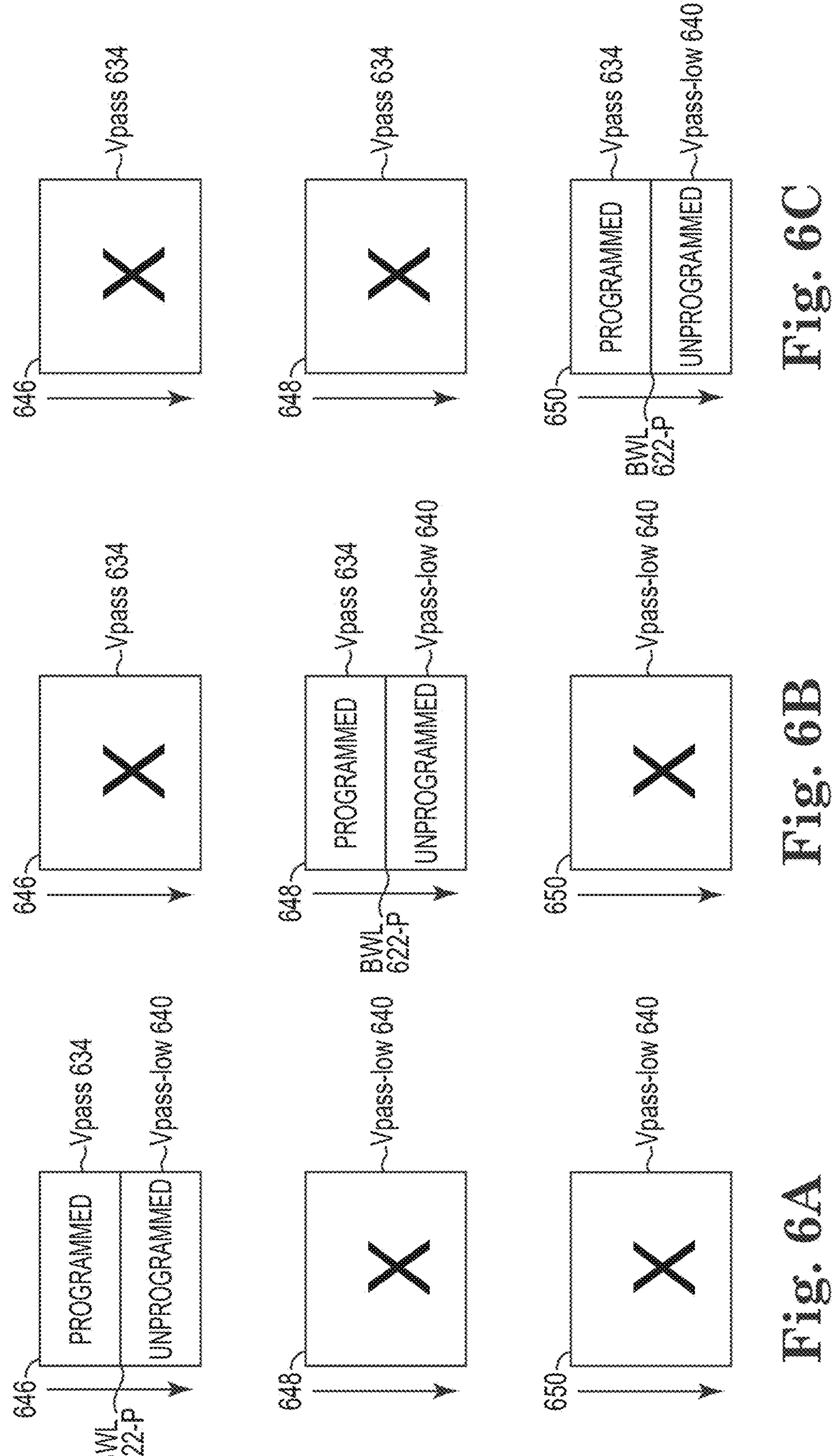
FIGS. 6A-6C illustrate operating voltages (e.g., bias conditions) associated with performing read operations on a good erase block of a single good erase block configuration in accordance with embodiments of the present disclosure.

FIGS. 6A-6C illustrate operating voltages (e.g., bias conditions) associated with performing read operations on a good erase block of a single good erase block configuration in accordance with embodiments of the present disclosure. A plurality of erase blocks can be partitioned where a first number of the plurality of erase blocks are indicated as being good and a second number of the plurality of erase blocks are indicated as being bad, where the good erase blocks are used to write and/or read data and the bad erase blocks are not used to read and/or write data. For example, in FIG. 6A, erase block 646 is a good erase block that is used to read and/or write data and erase blocks 648 and 650 are bad erase blocks that are not used to read and/or write data and are in an unprogrammed state. In FIGS. 6A-6C, a single erase block is indicated as good and the remaining erase blocks are indicated as bad.

In FIGS. 6A, good erase block 646 can be a partially programmed block, where word line 622-P is the boundary word line (BWL) (e.g., a last programmed word line in a partially programmed erase block). When sensing data from a programmed word line of the partially programmed good erase block 646, a sensing voltage can be applied to the selected programmed word line that is being sensed, pass voltage (Vpass) 634 can be applied to the unselected programmed word lines, and pass voltage (Vpass-low) 640 can be applied to the unselected unprogrammed word lines. Also, pass voltage (Vpass-low) 640 can be applied to the word lines of the bad erase blocks 648 and 650 when sensing data from a programmed word line of the partially programmed good erase block 646. The word lines of bad erase blocks 648 and 650 are unprogrammed state and therefore applying Vpass-low 640 to the word lines of bad erase blocks 648 and 650 can reduce the threshold voltage shift associated with sensing word lines in the partially programmed good erase block 646.

In FIG. 6B, erase block 648 is a good erase block that is used to read and/or write data and erase blocks 646 and 650 are bad erase blocks that are not used to read and/or write data and are in an unprogrammed state. Good erase block 648 can be a partially programmed block, where word line 622-P is the boundary word line (BWL) (e.g., a last programmed word line in a partially programmed erase block). When sensing data from a programmed word line of the partially programmed good erase block 648, a sensing voltage can be applied to the selected programmed word line that is being sensed, pass voltage (Vpass) 634 can be applied to the unselected programmed word lines, and pass voltage (Vpass-low) 640 can be applied to the unselected unprogrammed word lines. Also, pass voltage (Vpass) 634 can be applied to the word lines of the bad erase block 646 and pass voltage (Vpass-low) 640 can be applied to the word lines of the bad erase block 650 when reading data from a programmed word line of the partially programmed good erase block 648. The word lines of bad erase block 650 are unprogrammed state and therefore applying Vpass-low 640 to the word lines of bad erase block 650 can reduce the threshold voltage shift associated with sensing word lines in the partially programmed good erase block 648. The erase blocks 646, 648, and 650 are programmed drain to source, therefore pass voltage (Vpass) 634 can be applied to the word lines of bad erase block 646 without causing a threshold voltage shift when sensing word lines in the partially programmed good erase block 648.

In FIG. 6C, erase block 650 is a good erase block that is used to read and/or write data and erase blocks 646 and 648 are bad erase blocks that are not used to read and/or write data and are in an unprogrammed state. Good erase block 650 can be a partially programmed block, where word line 622-P is the boundary word line (BWL) (e.g., a last programmed word line in a partially programmed erase block). When sensing data from a programmed word line of the partially programmed good erase block 650, a sensing voltage can be applied to the selected programmed word line that is being sensed, pass voltage (Vpass) 634 can be applied to the unselected programmed word lines, and pass voltage (Vpass-low) 640 can be applied to the unselected unprogrammed word lines. Also, pass voltage (Vpass) 634 can be applied to the word lines of the bad erase blocks 646 and 648 when sensing data from a programmed word line of the partially programmed good erase block 650. The erase blocks 646, 648, and 650 are programmed drain to source, therefore pass voltage (Vpass) 634 can be applied to the word lines of bad erase blocks 646 and 648 without causing a threshold voltage shift when sensing word lines in the partially programmed good erase block 650.

Figures 7A, 7B, 7C:
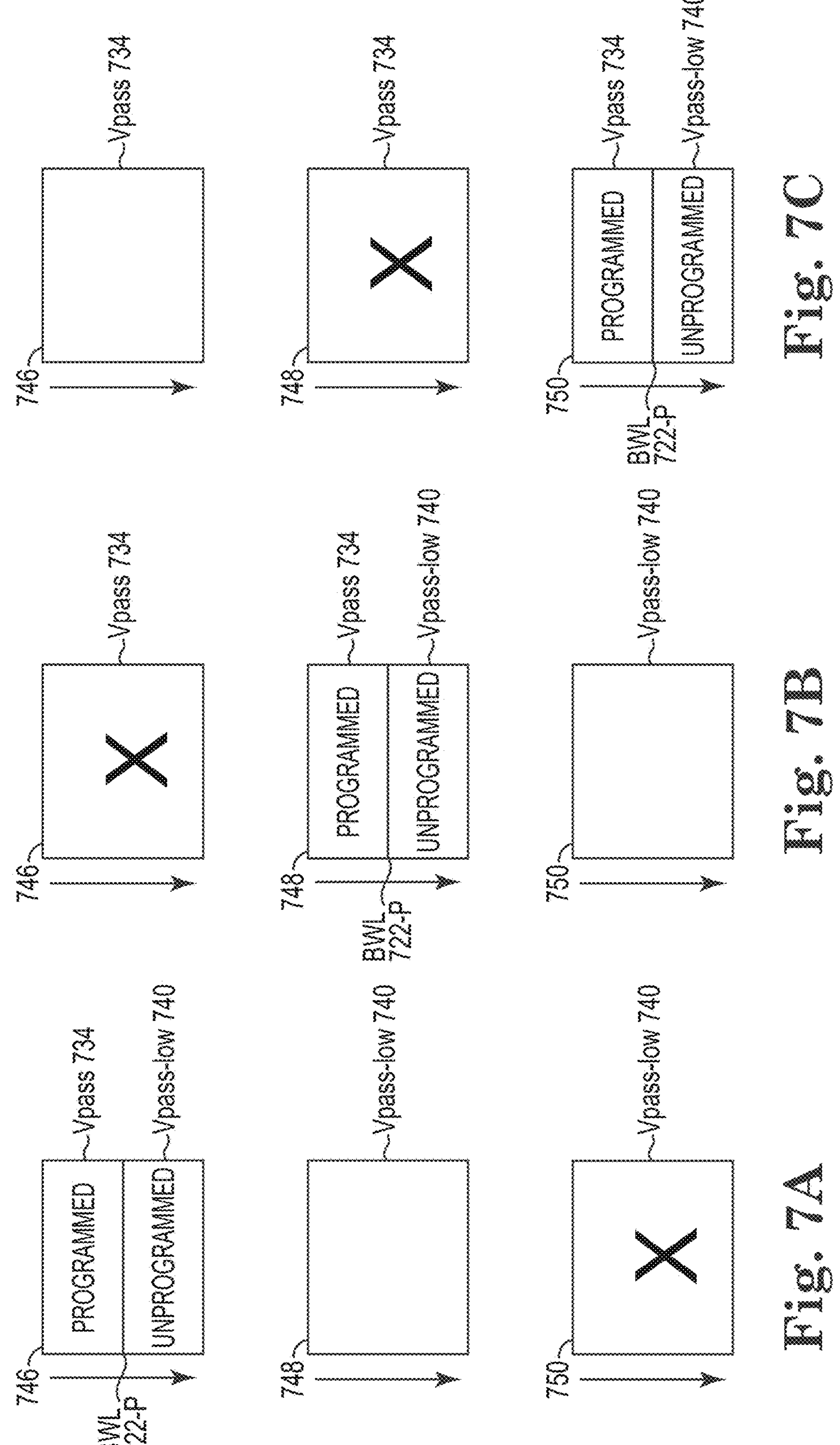
FIGS. 7A-7C illustrate operating voltages (e.g., bias conditions) associated with performing read operations on a good erase block of a multiple good erase block configuration in accordance with embodiments of the present disclosure.

FIGS. 7A-7C illustrate operating voltages (e.g., bias conditions) associated with performing read operations on a good erase block of a multiple good erase block configuration in accordance with embodiments of the present disclosure. A plurality of erase blocks can be partitioned where a first number of the plurality of erase blocks are indicated as being good and a second number of the plurality of erase blocks are indicated as being bad, where the good erase blocks are used to write and/or read data and the bad erase blocks are not used to read and/or write data. For example, in FIG. 7A, erase blocks 746 and 748 are good erase blocks that are used to read and/or write data and erase block 750 is a bad erase block that is not used to read and/or write data and are in an unprogrammed state. In FIGS. 7A-7C, two erase blocks are indicated as good and the remaining erase block is indicated as bad.

In FIGS. 7A, good erase blocks 746 can be a partially programmed block, where word line 722-P is the boundary word line (BWL) (e.g., a last programmed word line in a partially programmed erase block). When sensing data from a programmed word line of the partially programmed good erase block 746, a sensing voltage can be applied to the selected programmed word line that is being sensed, pass voltage (Vpass) 734 can be applied to the unselected programmed word lines, and pass voltage (Vpass-low) 740 can be applied to the unselected unprogrammed word lines. Also, pass voltage (Vpass-low) 740 can be applied to the word lines of good erase block 748 and bad erase block 750 when sensing data from a programmed word line of the partially programmed good erase block 746. Applying Vpass-low 740 to the word lines of good erase block 748 and bad erase block 750 can reduce the threshold voltage shift associated with sensing word lines in the partially programmed good erase block 746.

In FIG. 7B, erase block 746 is a bad erase block that is not used to read and/or write data and are in an unprogrammed state; and erase blocks 748 and 750 are good erase blocks that are used to read and/or write data and are in an unprogrammed state. Good erase block 748 can be a partially programmed block, where word line 722-P is the boundary word line (BWL) (e.g., a last programmed word line in a partially programmed erase block). When sensing data from a programmed word line of the partially programmed good erase block 748, a sensing voltage can be applied to the selected programmed word line that is being sensed, pass voltage (Vpass) 734 can be applied to the unselected programmed word lines, and pass voltage (Vpass-low) 740 can be applied to the unselected unprogrammed word lines. Also, pass voltage (Vpass) 734 can be applied to the word lines of the bad erase block 746 and pass voltage (Vpass-low) 740 can be applied to the word lines of the bad erase block 750 when sensing data from a programmed word line of the partially programmed good erase block 748. The word lines of good erase block 750 can be unprogrammed state and therefore applying Vpass-low 740 to the word lines of good erase block 750 can reduce the threshold voltage shift associated with sensing word lines in the partially programmed good erase block 748. The erase blocks 746, 748, and 750 are programmed drain to source, therefore pass voltage (Vpass) 734 can be applied to the word lines of bad erase block 746 without causing a threshold voltage shift when sensing word lines in the partially programmed good erase block 748.

In FIG. 7C, erase blocks 746 and 750 are a good erase block that are used to read and/or write data and erase block 748 is a bad erase block that is not used to read and/or write data and are in an unprogrammed state. Good erase block 750 can be a partially programmed block, where word line 722-P is the boundary word line (BWL) (e.g., a last programmed word line in a partially programmed erase block). When sensing data from a programmed word line of the partially programmed good erase block 750, a sensing voltage can be applied to the selected programmed word line that is being sensed, pass voltage (Vpass) 734 can be applied to the unselected programmed word lines, and pass voltage (Vpass-low) 740 can be applied to the unselected unprogrammed word lines. Also, pass voltage (Vpass) 734 can be applied to the word lines of the good erase block 746 and bad erase block 748 when sensing data from a programmed word line of the partially programmed good erase block 750. The erase blocks 746, 748, and 750 are programmed drain to source, therefore pass voltage (Vpass) 734 can be applied to the word lines of good erase block 746 and bad erase block 748 without causing a threshold voltage shift when sensing word lines in the partially programmed good erase block 750.

Embodiments are not limited to 3 erase block configurations and may include configurations with 4 or more erase blocks. In embodiments with multiple erase blocks and combinations of the multiple erase blocks are indicated as good or bad, pass voltage (Vpass) can be applied to bad blocks on the drain side of a good erase block and pass voltage (Vpass-low) can be applied to bad blocks on the source side of a good erase block when the erase blocks are programmed drain to source. In embodiments with multiple erase blocks and combinations of the multiple erase blocks are indicated as good or bad, pass voltage (Vpass) can be applied to bad blocks on the source side of a good erase block and pass voltage (Vpass-low) can be applied to bad blocks on the drain side of a good erase block when the erase blocks are programmed source to drain.

Figures 8A, 8B, 8C:
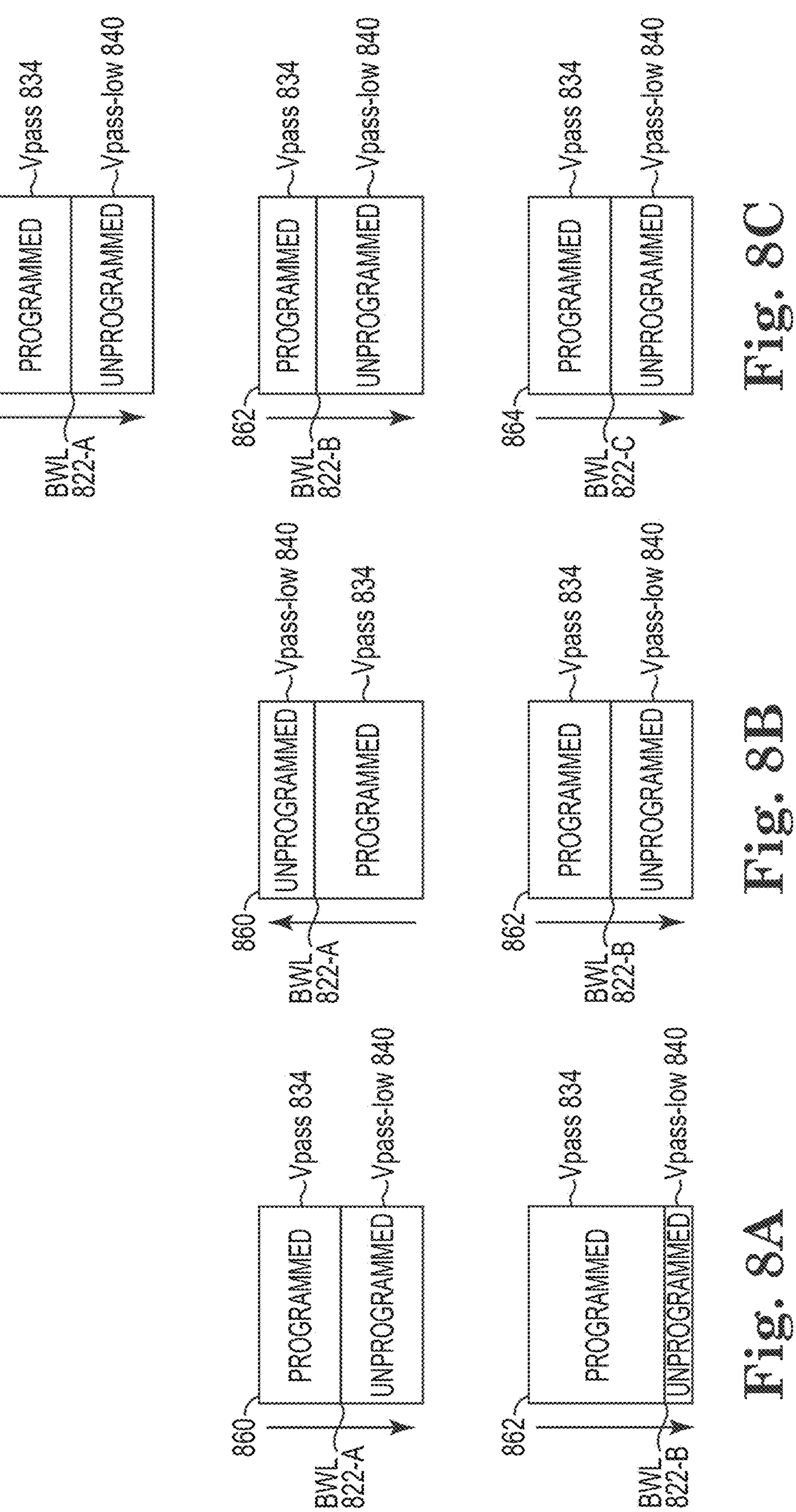
FIGS. 8A-8C illustrate operating voltages (e.g., bias conditions) associated with performing sensing operations on partially programmed erase blocks in accordance with embodiments of the present disclosure.

FIGS. 8A-8C illustrate operating voltages (e.g., bias conditions) associated with performing sensing operations on partially programmed erase blocks in accordance with embodiments of the present disclosure. A plurality of erase blocks can be individually programmed and erased. Each of the plurality of erase blocks can be partially programmed.

In FIG. 8A, erase blocks 860 and 862 are partially programmed where word line 822-A is the boundary word line (BWL) (e.g., a last programmed word line in a partially programmed erase block) in erase block 860 and word line 822-B is the boundary word line (BWL) in erase block 862. Erase blocks 860 and 862 in FIG. 8A are programmed drain to source as indicated by the arrows to the left of each erase block.

In FIG. 8A, when reading data from a programmed word line of the partially programmed erase block 860, a sensing voltage can be applied to the selected programmed word line that is being sensed, pass voltage (Vpass) 834 can be applied to the unselected programmed word lines and pass voltage (Vpass-low) 840 can be applied to the unselected unprogrammed word lines. Applying Vpass-low 840 to the unselected unprogrammed word lines in partially programmed erase block 860 can reduce the threshold voltage shift associated with reading word lines in the partially programmed erase block 860. When sensing data from a programmed word line of the partially programmed erase block 862, a sensing voltage can be applied to the selected programmed word line that is being sensed, pass voltage (Vpass) 834 can be applied to the unselected programmed word lines, and pass voltage (Vpass-low) 840 can be applied to the unselected unprogrammed word lines. Applying Vpass-low 840 to the unselected unprogrammed word lines in partially programmed erase block 862 can reduce the threshold voltage shift associated with reading word lines in the partially programmed erase block 862.

In FIG. 8B, erase blocks 860 and 862 are partially programmed where word line 822-A is the boundary word line (BWL) (e.g., a last programmed word line in a partially programmed erase block) in erase block 860 and word line 822-B is the boundary word line (BWL) in erase block 862. Erase blocks 860 and 862 in FIG. 8B are programmed center to edge as indicated by the arrows to the left of each erase block.

In FIG. 8B, when reading data from a programmed word line of the partially programmed erase block 860, a sensing voltage can be applied to the selected programmed word line that is being sensed, pass voltage (Vpass) 834 can be applied to the unselected programmed word lines and pass voltage (Vpass-low) 840 can be applied to the unselected unprogrammed word lines. Applying Vpass-low 840 to the unselected unprogrammed word lines in partially programmed erase block 860 can reduce the threshold voltage shift associated with reading word lines in the partially programmed erase block 860. When sensing data from a programmed word line of the partially programmed erase block 862, a sensing voltage can be applied to the selected programmed word line that is being sensed, pass voltage (Vpass) 834 can be applied to the unselected programmed word lines, and pass voltage (Vpass-low) 840 can be applied to the unselected unprogrammed word lines. Applying Vpass-low 840 to the unselected unprogrammed word lines in partially programmed erase block 862 can reduce the threshold voltage shift associated with reading word lines in the partially programmed erase block 862.

In FIG. 8C, erase blocks 860, 862, 864 are partially programmed where word line 822-A is the boundary word line (BWL) (e.g., a last programmed word line in a partially programmed erase block) in erase block 860, word line 822-B is the boundary word line (BWL) in erase block 862, and word line 822-C is the boundary word line (BWL) in erase block 864. Erase blocks 860, 862, 864 in FIG. 8C are programmed drain to source as indicated by the arrows to the left of each erase block.

In FIG. 8C, when reading data from a programmed word line of the partially programmed erase block 860, a sensing voltage can be applied to the selected programmed word line that is being sensed, pass voltage (Vpass) 834 can be applied to the unselected programmed word lines and pass voltage (Vpass-low) 840 can be applied to the unselected unprogrammed word lines. Applying Vpass-low 840 to the unselected unprogrammed word lines in partially programmed erase block 860 can reduce the threshold voltage shift associated with reading word lines in the partially programmed erase block 860. When sensing data from a programmed word line of the partially programmed erase block 862, a sensing voltage can be applied to the selected programmed word line that is being sensed, pass voltage (Vpass) 834 can be applied to the unselected programmed word lines, and pass voltage (Vpass-low) 840 can be applied to the unselected unprogrammed word lines. Applying Vpass-low 840 to the unselected unprogrammed word lines in partially programmed erase block 862 can reduce the threshold voltage shift associated with reading word lines in the partially programmed erase block 862. When sensing data from a programmed word line of the partially programmed erase block 864, a sensing voltage can be applied to the selected programmed word line that is being sensed, pass voltage (Vpass) 834 can be applied to the unselected programmed word lines, and pass voltage (Vpass-low) 840 can be applied to the unselected unprogrammed word lines. Applying Vpass-low 840 to the unselected unprogrammed word lines in partially programmed erase block 864 can reduce the threshold voltage shift associated with reading word lines in the partially programmed erase block 864.

Figure 9:
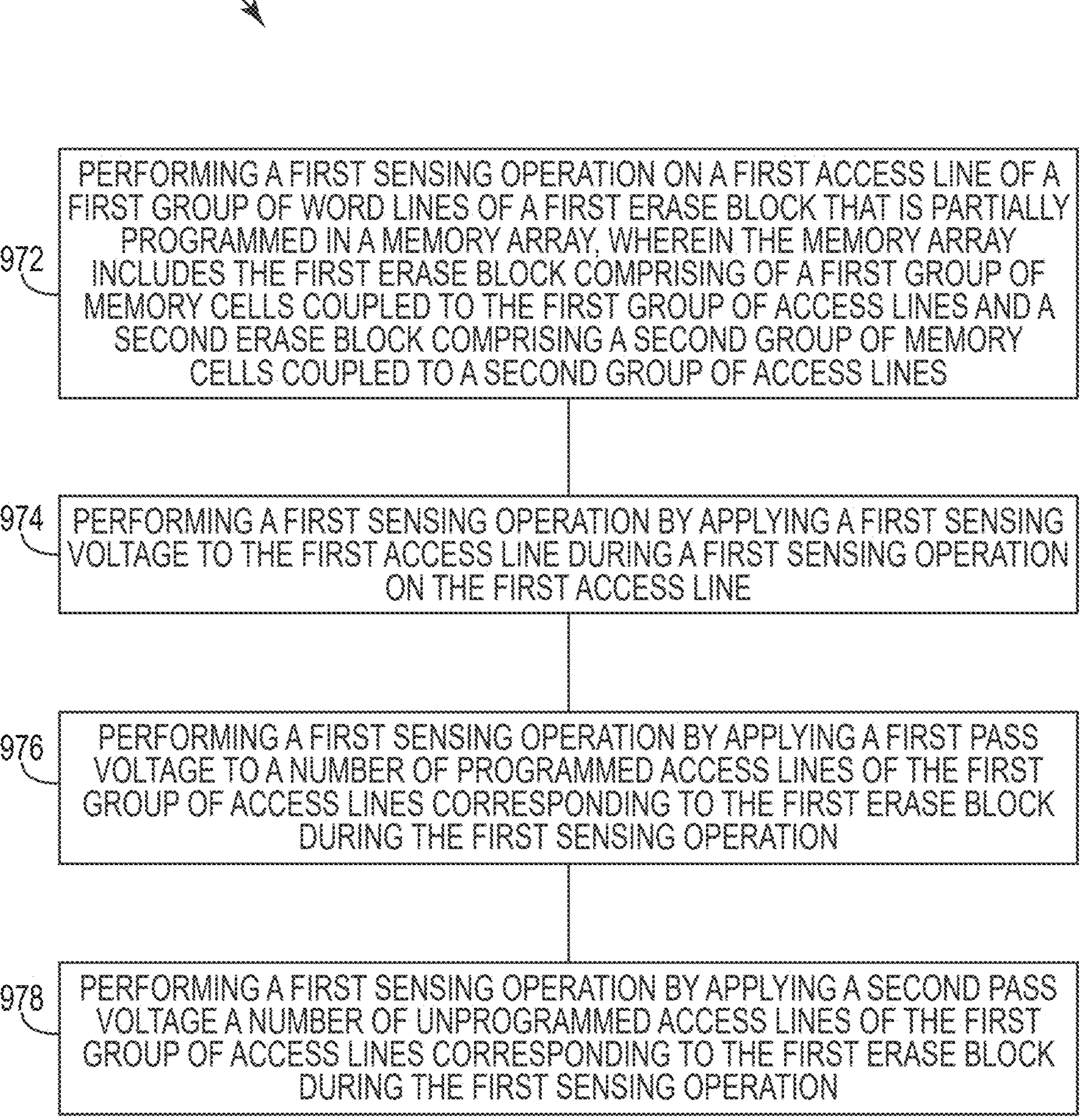
FIG. 9 is a flow diagram illustrating a method for operating a controller configured for sensing operations on partially programmed erase blocks in accordance with embodiments of the present disclosure.

FIG. 9 is a flow diagram illustrating a method for operating a controller configured for sensing operations on partially programmed erase blocks in accordance with embodiments of the present disclosure. The method 970 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 970 can be performed using the pass voltage offset component 124 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 972, the method can include performing a first sensing operation on a first access line of a first group of word lines of a first erase block that is partially programmed in a memory array, wherein the memory array includes the first erase block comprising a first group of memory cells coupled to the first group of access lines and a second erase block comprising a second group of memory cells coupled to a second group of access lines.

At 974, the method can include performing a first sensing operation by applying a first sensing voltage to the first access line during a first sensing operation on the first access line.

At 976, the method can include performing a first sensing operation by applying a first pass voltage to a number of programmed access lines of the first group of access lines corresponding to the first erase block during the first sensing operation.

At 978, the method can include performing a first sensing operation by applying a second pass voltage to a number of unprogrammed access lines of the first group of access lines corresponding to the first erase block during the first sensing operation. A magnitude of the second pass voltage can be less than a magnitude of the first pass voltage.

The method can include performing a second sensing operation on a second access line of the second group of access lines corresponding to the second erase block that is partially programmed. Performing the second sensing operation can include applying a second sensing voltage to the second access line, applying the first pass voltage to a number of programmed access lines of the second group of access lines corresponding to the second erase block, and applying a third pass voltage to a number of unprogrammed access lines of the second group of access lines corresponding to the second erase block during the second sensing operation. A magnitude of the third pass voltage can be different than a magnitude of the second pass voltage.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:

a memory array comprising a plurality of erase blocks, wherein the plurality of erase blocks comprise a first group of memory cells coupled to a first group of access lines and corresponding to a first erase block and a second group of memory cells coupled to a second group of access lines and corresponding to a second erase block; and a controller coupled to the memory array and configured to:

determine that a sensing operation request is for data stored in the first group of memory cells on a first access line of the first group of access lines corresponding to the first erase block, wherein the first erase block is partially programmed; and apply a first sensing voltage to the first access line during a first sensing operation on the first access line;

apply a first pass voltage to a number of programmed access lines of the first group of access lines corresponding to the first erase block during the first sensing operation;

apply a second pass voltage to a number of unprogrammed access lines of the first group of access lines corresponding to the first erase block during the first sensing operation;

determine that a second sensing operation request is for data stored in the second group of memory cells on a second access line of the second group of access lines corresponding to the second erase block, wherein the second erase block is partially programmed;

apply a second sensing voltage to the second access line during a second sensing operation on the second access line;

apply the first pass voltage to a number of programmed access lines of the second group of access lines corresponding to the second erase block during the second sensing operation; and apply the second pass voltage to a number of unprogrammed access lines of the second group of access lines corresponding to the second erase block during the second sensing operation.

2. The apparatus of claim 1, wherein the partially programmed first erase block comprises the number of programmed word lines that include a number of programmed inner access lines and a programmed boundary access line and wherein the first access line is one of the number of programmed inner access lines.

3. The apparatus of claim 2, wherein the partially programmed block comprises the number of unprogrammed word lines and wherein a first unprogrammed word line of the number of unprogrammed word lines is adjacent to the boundary word line.

4. The apparatus of claim 1, wherein a magnitude of the second pass voltage is less than a magnitude of the first pass voltage.

5. The apparatus of claim 1, wherein the first sensing operation is a program verify operation and the second sensing operation is a read operation.

6. The apparatus of claim 1, wherein the plurality of erase blocks comprise a third group of memory cells coupled to a third group of access lines and corresponding to a third erase block.

7. The apparatus of claim 6, determine that a third sensing operation request is for data stored in the third group of memory cells on a third access line of the third group of access lines corresponding to the third erase block, wherein the third erase block is a partially programmed; and apply a third sensing voltage to the third access line during a third sensing operation on the third access line; apply the first pass voltage to a number of programmed access lines of the third group of access lines corresponding to the third erase block during the third sensing operation; and apply the second pass voltage to a number of unprogrammed access lines of the third group of access lines corresponding to the third erase block during the third sensing operation.

8. An apparatus, comprising:

a memory array comprising a plurality of erase blocks, wherein the plurality of erase blocks comprise a first group of memory cells coupled to a first group of access lines and corresponding to a first erase block, a second group of memory cells coupled to a second group of access lines and corresponding to a second erase block, and a third group of memory cells coupled to a third group of access lines and corresponding to a third erase block; and a controller coupled to the memory array and configured to:

determine that a sensing operation request is for data stored in the first group of memory cells on a first access line of the first group of access lines corresponding to the first erase block, wherein the first erase block is partially programmed; and in response to the first erase block being a good erase block and the second and third erase blocks being bad erase blocks:

apply a first sensing voltage to the first access line during a first sensing operation on the first access line;

apply a first pass voltage to a number of programmed access lines of the first group of access lines corresponding to the first erase block during the first sensing operation; and apply a second pass voltage to a number of unprogrammed access lines of the first group of access lines corresponding to the first erase block during the first sensing operation, to the second group of access lines corresponding to the second erase block during the first sensing operation, and to the third group of access lines corresponding to the third erase block during the first sensing operation.

9. The apparatus of claim 8, wherein the first pass voltage is applied to the third group of access lines corresponding to the third erase block during the first sensing operation.

10. The apparatus of claim 8, wherein the first pass voltage is applied to the second group of access lines corresponding to the second erase block during the first sensing operation, and wherein the first pass voltage is applied to the third group of access lines corresponding to the third erase block during the first sensing operation.

11. The apparatus of claim 8, wherein the controller is configured to:

in response to the first erase block and the second erase block being good erase blocks and the third erase blocks being a bad erase block:

apply the first sensing voltage to the first access line during the first sensing operation on the first access line;

apply the first pass voltage to the number of programmed access lines of the first group of access lines corresponding to the first erase block during the first sensing operation; and apply a second pass voltage to a number of unprogrammed access lines of the first group of access lines corresponding to the first erase block during the first sensing operation, to the second group of access lines corresponding to the second erase block during the first sensing operation, and to the third group of access lines corresponding to the third erase block during the first sensing operation.

12. The apparatus of claim 11, wherein the second pass voltage is applied to the second group of access lines corresponding to the second erase block during the first sensing operation, and wherein the first pass voltage is applied to the third group of access lines corresponding to the third erase block during the first sensing operation.

13. The apparatus of claim 11, wherein the first pass voltage is applied to the second group of access lines corresponding to the second erase block during the first sensing operation, and wherein the first pass voltage is applied to the third group of access lines corresponding to the third erase block during the first sensing operation.

14. A method, comprising:

performing a first sensing operation on a first access line of a first group of word lines of a first erase block that is partially programmed in a memory array, wherein the memory array includes the first erase block comprising a first group of memory cells coupled to the first group of access lines and a second erase block comprising a second group of memory cells coupled to a second group of access lines, wherein performing the first sensing operation includes:

applying a first sensing voltage to the first access line during a first sensing operation on the first access line;

applying a first pass voltage to a number of programmed access lines of the first group of access lines corresponding to the first erase block during the first sensing operation; and applying a second pass voltage to a number of unprogrammed access lines of the first group of access lines corresponding to the first erase block during the first sensing operation; and performing a second sensing operation on a second access line of the second group of access lines corresponding to the second erase block that is partially programmed.

15. The method of claim 14, wherein a magnitude of the second pass voltage is less than a magnitude of the first pass voltage.

16. The method of claim 14, wherein performing the second sensing operation includes applying a second sensing voltage to the second access line, applying the first pass voltage to a number of programmed access lines of the second group of access lines corresponding to the second erase block, and applying a third pass voltage to a number of unprogrammed access lines of the second group of access lines corresponding to the second erase block during the second sensing operation.

17. The method of claim 16, wherein a magnitude of the third pass voltage is different than a magnitude of the second pass voltage.

* * * * *